United States Patent [19]
Leas

[11] Patent Number: 5,841,293
[45] Date of Patent: Nov. 24, 1998

[54] METHOD AND APPARATUS FOR SCREENING INTEGRATED CIRCUIT CHIPS FOR LATCH-UP SENSITIVITY

[75] Inventor: James Marc Leas, South Burlington, Vt.

[73] Assignee: International Business Machines Corporation, Armonk, N.Y.

[21] Appl. No.: 581,861

[22] Filed: Dec. 22, 1995

[51] Int. Cl.$^6$ .............................. G01R 1/04; G01R 31/26
[52] U.S. Cl. ........................ 324/765; 324/73.1; 324/158.1
[58] Field of Search ................................. 324/73.1, 72.5, 324/158.1

[56] References Cited

U.S. PATENT DOCUMENTS 4,786,865  11/1988  Arimura et al. ........................ 324/73.1
5,396,169   3/1995  Buehler ................................ 324/158.1

Primary Examiner—Kenneth A. Wieder
Assistant Examiner—Barry C. Bowser
Attorney, Agent, or Firm—Eugene I. Shkurko

[57] ABSTRACT

Integrated circuit chips are screened for susceptibility to latch-up by first applying power and ground to the chips to be tested while limiting current flow to a non-destructive compliance value. Next, the chips are irradiated with a pulse of radiation having an energy dose calibrated to trigger latch-up in latch-up sensitive chips. Upon termination of the radiation, the current is detected. Chips having current persisting at the compliance value are indicated as failing. The current in passing chips returns approximately to the original standby current value. In the preferred embodiment, the radiation is visible light and the radiation energy dose is selected to cause a percentage of chips to latch-up approximating the percentage of failures expected at burn-in.

19 Claims, 2 Drawing Sheets

METHOD AND APPARATUS FOR SCREENING INTEGRATED CIRCUIT CHIPS FOR LATCH-UP SENSITIVITY

BACKGROUND OF THE INVENTION

1. Technical Field of the Invention

The present invention relates to the testing of semiconductor chips, and more particularly, to a method and apparatus for screening integrated circuit chips for latch-up sensitivity at the wafer level.

2. Background Art

A major failure mechanism in integrated circuits, and particularly in complementary metal oxide semiconductor circuits (CMOS), is an uncontrolled current flow, known as latch-up. CMOS circuits are particularly susceptible to this type of failure due to the inherent formation of parasitic pnpn or npnp regions between adjoining CMOS sections or devices.

As is well known, under certain conditions these parasitic pnpn or npnp regions can provide a self-sustaining low impedance path, shunting adjoining sections of a device to result in very high current flow therein, sufficient to destroy the chip. Once established or triggered, this latch-up current cannot be interrupted except by the removal of the power supply voltage. Various perturbations trigger latch-up, including DC over voltage, transients, electrostatic discharge, and pulses of light.

Presently, the most susceptible chips are generally only screened out at a much later stages of manufacturing, typically after the chip has been packaged. The susceptibility is then usually found during burned-in. While arrangements are presently available to reduce latch-up by improved design, ground rules, and layout, none completely solve the problem. Hence, it is desirable to efficiently screen out latch-up susceptible chips, especially at an early stage of manufacturing. Accordingly there exists a need for an improved testing process and apparatus for economically and efficiently screening integrated circuit chips for latch-up sensitivity at the wafer level.

SUMMARY OF THE INVENTION

It is therefore an object of the present invention to provide an improved method and apparatus for screening semiconductor chips for susceptibility to latch-up using a wafer-level test.

It is a feature of the present invention that a latch-up sensitive chip is screened from a population of chips using a test comprising a pulse of light.

It is an advantage of the present invention that integrated circuit chips are screened for latch-up sensitivity without risk of damaging either good chips or latch-up sensitive chips.

These and other objects of the present invention are accomplished by applying power and ground voltage to the chip; limiting current flow in the chip to a compliance value; irradiating the powered-up chip with a pulse of radiation, said radiation providing an energy dose to the chip calibrated to trigger latch-up in a latch-up sensitive chip so as to distinguish passing and failing chips, wherein, following said radiation pulse, current in a failing chip remains approximately at said compliance value; detecting current in the chip after said irradiating step (c) is complete; and indicating the chip as passing or failing.

In the preferred embodiment, chips are irradiated with a pulse of visible light sufficient to cause latch-up current in a fraction of the chips approximately equal to the percentage of failures found for such chips at burn-in. To preclude damage to the chips under test, the apparatus is configured to limit the current to a value less than a current that would cause damage to the chips but significantly higher than the chip standby current. The radiation dose is set so a percentage of chips fail, the percentage being approximately equal to the percentage of chips anticipated to fail in burn-in.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
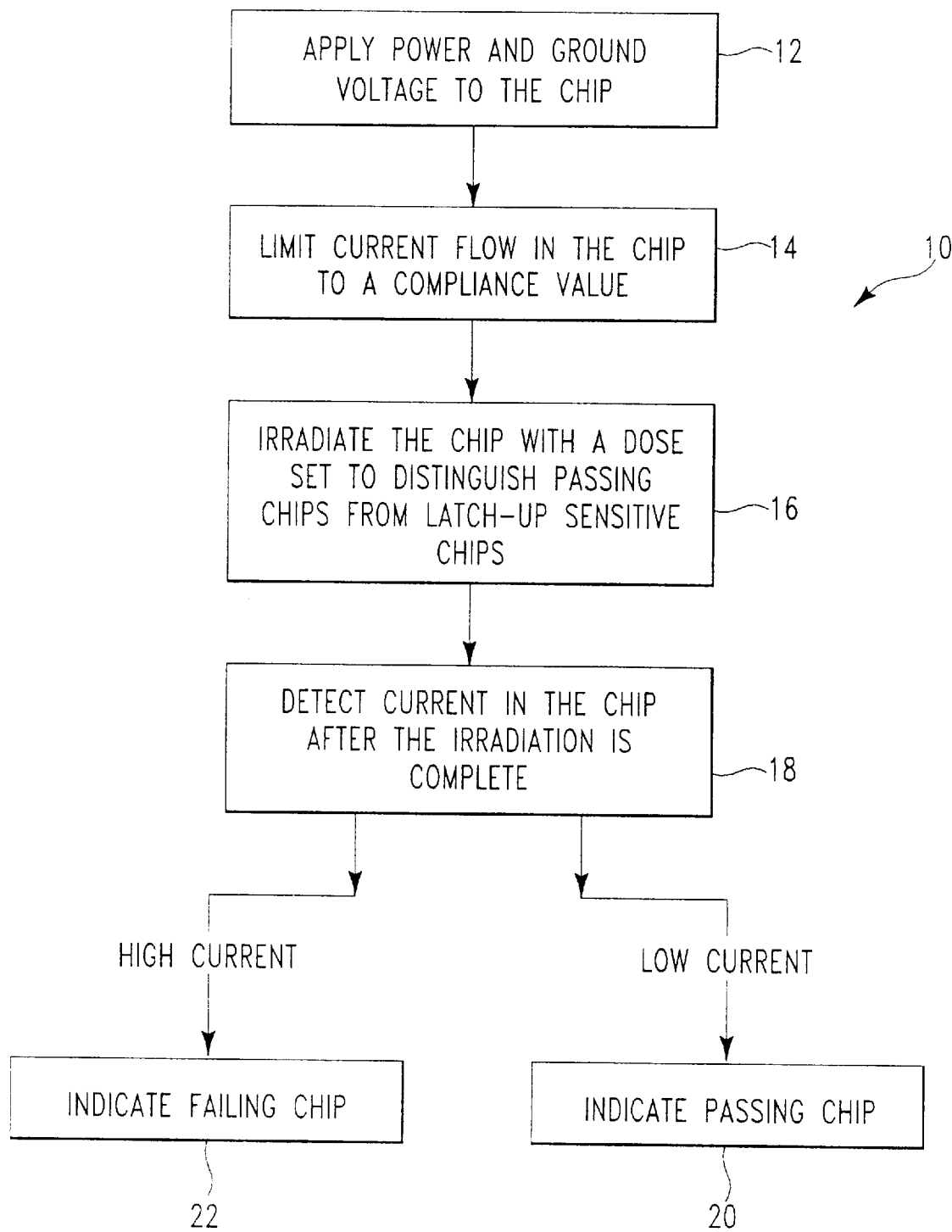
FIG. 1 is a flow chart illustrating a preferred method of screening semiconductor chips in accordance with the present invention.

As shown in FIG. 1, method 10 of the invention includes the steps of applying power and ground voltages, as designated in function block 12, to an integrated circuit chip on a wafer. With only power and ground applied in the dark or at a low level of illumination, a low level of standby current flows through the chip. Standby current is typically in the range of microamps to milliamps. In preparation for the next step, a conventional controllable current limiting circuit, usually part of the power supply, is used to limit current to a compliance value as indicated in function block 14. The compliance value is selected to be significantly higher than the standby current but low enough to prevent damage to the chip in the illumination step that follows. The compliance current may be set to a value less than or equal to the design current level of the chip. High current flows in all chips during the light pulse in the next step, and the current limit precludes damage both to chips that latch-up and those that do not.

The chip is then irradiated with a pulse of radiation, preferably visible light, with a dose sufficient to trigger latch-up in latch-up sensitive chips as called for in block 16.

After the pulse of radiation is complete, the current in a passing chip returns to a low level, approximately to the standby current level; the current in a failing latched-up chip remains high, approximately the compliance value. Current flowing in the chip is then detected, as shown in function block 18. The chip is then sorted as passing or failing, as indicated in function blocks 20 and 22 respectively, high current chips indicated as failing, low current chips as passing.

The power supply voltage is typically the normal operational voltage of the chip, typically in the range of 2.5 to 5 volts, but higher or lower voltages can be used. A voltage as high as the burn-in voltage can be employed without undue stress, for example. As the applied voltage increases a greater number of suspect chips will latch-up with the same level of illumination, and hence, the radiation dose may be reduced to compensate for this increased sensitivity. Thus, the radiation dose set to distinguish passing chips from latch-up sensitive chips can be controlled either by adjusting the light intensity incident on the chip or by adjusting the power supply voltage.

Figure 2:
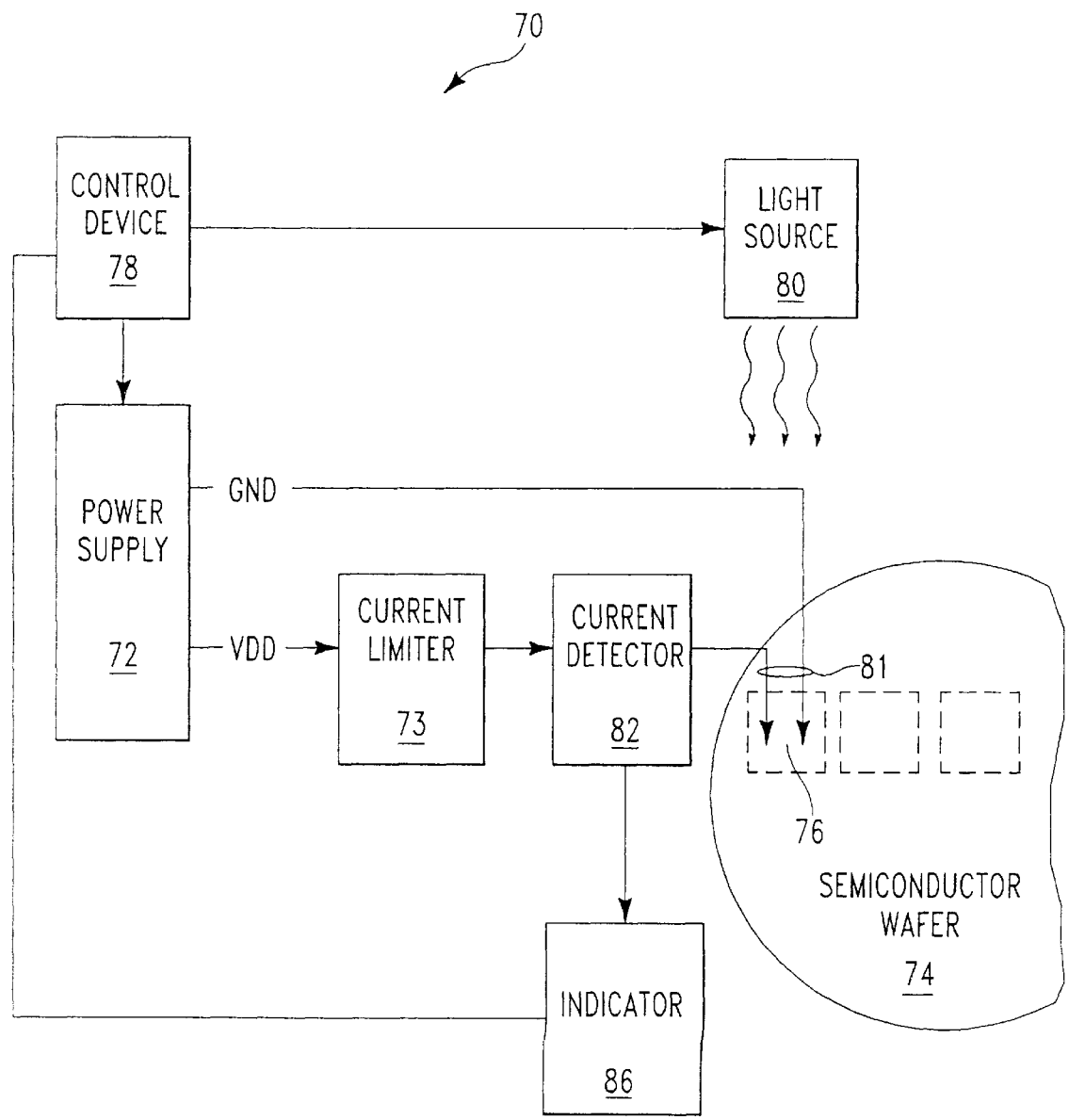
FIG. 2 illustrates a diagrammatic block diagram of the preferred embodiment of the test apparatus in accordance with the present invention.

Power and ground voltages are applied to the chip through suitable electrical probes, shown schematically in FIG. 2. Advantageously, the method can be accomplished with only power and ground contacts to the chip. Ground contact can be accomplished either with probes to the ground conductor on the front of the chip or through a wafer chuck contacting the back surface of the wafer.

Any source of radiation can be employed so long as it will produce a sufficient number of electron hole pairs in CMOS circuits to trigger latch-up. Thus, the radiation must be energetic enough to exceed the band gap of the semiconductor. Visible light sources capable of supplying a light pulse, such as xenon or tungsten sources, or a photographic strobe, are suitable.

For screening, the energy dose imparted to the chip is adjusted to produce a failure rate generally equal to the anticipated failure rate for the design of the chips under test. For example, the energy dose is tailored to latch-up a fraction of the chips approximately equal to the failure rate normally produced at burn in.

In preparing for an initial screening, a test is made using a trial radiation dose on a sample of chips. It is preferable to shine light on the entire chip at one time. Thus, all portions of the chip are screened simultaneously. The chip failure rate is compared to the failure rate at burn-in for the given chip type. The radiation intensity is then adjusted and the chips are retested in a subsequent trial with an adjusted light level to provide the desired failure rate. The radiation dose imparted to each chip may be varied by methods such as changing the distance between radiation source and chip or by varying the pulse time. Thus, the distance between the light source and the chip is increased or decreased in accordance with the deviation of the test results from the burn-in data for the chip type under test until the latch-up screen results approximate the burn-in failure rate. Once a reasonable amount of screening data is accumulated and compared with subsequent latch-up fallout at burn-in, the illumination energy dose of the screening test can be further varied to assure that latch up sensitive chips are screened out while avoiding screening out an excessive number of good chips.

Test apparatus 70, provided in accordance with the preferred embodiment of the invention and illustrated in FIG. 2, includes power supply 72 having current limiter 73 for providing power supply voltage Vdd and ground to semiconductor wafer 74, and specifically to one of its chips 76 shown in dotted outline.

Control device 78 is connected to power supply 72 and to light source 80 to control the switching on of power supply 72 and light source 80. Probes 81 are configured to sequentially probe each chip 76 on the wafer using conventional wafer stepping apparatus. Light source 80 is mounted to provide illumination for each chip probed.

Current limiter 73 restricts current flow in each chip 76 to a compliance level, less than the design level of the chips so as to avoid damage both to good chips and to chips that latch up. Coupled between power supply 72 and chip 76 is current detector 82 and indicator 86.

In operation of the illustrated apparatus, once semiconductor chip 76 has been probed with probes 81, control device 78 turns on power supply 72 having current limiter 73. Control device 78 then fires light source 80 to illuminate chips 76. Detector 82 and indicator 86 define and record the test results. While not shown in FIG. 2, control device 78 also turns off power supply 72 following operation of detector 82 and indicator 86.

As illustrated in FIG. 2, current limiter 82, detector 84, and indicator 86 are connected in the power side of power supply 72. They can just as easily be on the ground side, however. They components can also be integrated with power supply 72 into a single unit. Moreover, while various units shown in apparatus 70, are described as powered up, and triggered on, by control device 78, these functions can be provided by many other arrangements. For example, once power supply 72 is rendered operable, it can turn on current limiter 82 and fire illumination source 80. Upon termination of the illumination, light source 80 may, in turn, activate detector 84 and indicator 86. Then, the latter unit can shut off power supply 72.

Preferably detector 82 measures current flowing in the chip and compares the measured current with a current specification limit. The chip is marked by indicator 86 if the current exceeds the specification limit. The limit need not be as high as the compliance current. It is significantly higher than the normal standby current.

The screening test of the present invention can be accomplished at an early stage of manufacturing, as soon as a level of metallization linking devices is available for connection to power supply 72. While levels of metallization shadow the silicon surface, the lifetime of minority carriers in high quality single crystal silicon is in the range of hundreds of microseconds, ample time for minority carriers to diffuse many tens of micrometers to trigger latch-up. Thus, only a fraction of the semiconductor surface need be available to receive the light pulse. The screening test can be accomplished either when chip processing is complete or earlier, before planes of metallization are deposited. In the latter case a plurality of probes are preferred aligned to several of the disconnected power conductors.

Since changes may be made in the above structure and process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims. Accordingly, the scope of protection of this invention is limited only by the following claims and their equivalents.

We claim:

1. A method of screening a semiconductor chip for susceptibility to latch-up, the method comprising the steps of:
    a) applying power and ground voltage to the chip;
    b) limiting current flow in the chip to a compliance value;
    c) irradiating the powered-up chip with a pulse of radiation, said radiation providing an energy dose to the chip calibrated to trigger latch-up in a latch-up sensitive chip so as to distinguish passing and failing chips, wherein, following said radiation pulse, current in a failing chip remains approximately at said compliance value;
    d) detecting current in the chip after said irradiating step (c) is complete; and
    e) indicating the chip as passing or failing.

2. The method of claim 1, wherein said detecting step (d) includes measuring current flow in the chip.

3. The method of claim 1, wherein said detecting step (d) includes determining whether current flow in the chip is equal to or greater than a specified value.

4. The method of claim 1, said radiation being visible light.

5. The method of claim 1, the chip having a standby current, said compliance value being significantly higher than the standby current and less than a current level that damages the chip.

6. The latch-up tester of claim 5, wherein, following said radiation pulse, current in a passing chip returns approximately to the standby current level.

7. The method of claim 1, wherein in said irradiating step (c) said dose being set so a percentage of chips fail.

8. The method of claim 7, wherein in said irradiating step (c) said percentage being approximately equal to the percentage of chips that fail in burn-in.

9. A tester for testing a semiconductor chip for susceptibility to latch-up, the tester comprising:
- a power supply for supplying power and ground voltage to the chip for test;
- a compliance current limiter set to limit current to a compliance value;
- an irradiation source capable of irradiating the powered-up chip with a pulse of radiation, said radiation for providing an energy dose to the chip calibrated to trigger latch-up in a latch-up sensitive chip so as to distinguish passing and failing chips, wherein, following said radiation pulse, current in a failing chip remains approximately at said compliance value;
- a current detector; and
- an indicator to sort the chip as passing or failing after said pulse of radiation is complete.

10. The latch-up tester of claim 9, wherein said detector measures current flow in the chip.

11. The latch-up tester of claim 10, wherein said detector determines whether current flow in the chip is equal to or greater than a specified value.

12. The latch-up tester of claim 9, said radiation being visible light.

13. The latch-up tester of claim 9, the chip having a standby current, said compliance value being significantly higher than the standby current and less than a current level that damages the chip.

14. The latch-up tester of claim 13, wherein, following said radiation pulse, current in a passing chip returns approximately to the standby current level.

15. The latch-up tester of claim 9, said dose being set so a percentage of chips fail.

16. The latch-up tester of claim 15, said percentage being approximately equal to the percentage of chips that fail in burn-in.

17. The method of claim 1, wherein in said irradiating step (c), irradiating said chip with exactly one said pulse.

18. The method of claim 1, wherein in said irradiating step (c), irradiating said entire chip with said pulse.

19. The latch-up tester of claim 1, said radiation source being capable of irradiating said entire chip with said pulse.

* * * * *